United States Patent
Jung

(10) Patent No.: US 11,337,346 B2
(45) Date of Patent: May 17, 2022

(54) ELECTRONIC COMPONENT MODULE AND MANUFACTURING METHOD THEREOF

(71) Applicant: Samsung Electro-Mechanics Co., Ltd., Suwon-si (KR)

(72) Inventor: Chul Hwan Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/031,110

(22) Filed: Sep. 24, 2020

(65) Prior Publication Data
US 2021/0007250 A1    Jan. 7, 2021

Related U.S. Application Data

(63) Continuation of application No. 16/367,641, filed on Mar. 28, 2019, now Pat. No. 10,820,456.

(30) Foreign Application Priority Data

Sep. 14, 2018 (KR) .................. 10-2018-0110201

(51) Int. Cl.
*H05K 1/14* (2006.01)
*H05K 9/00* (2006.01)
(Continued)

(52) U.S. Cl.
CPC ......... *H05K 9/0083* (2013.01); *H05K 1/0216* (2013.01); *H05K 1/111* (2013.01);
(Continued)

(58) Field of Classification Search
USPC .............. 361/736, 728, 760, 761, 792; 174/260–262
See application file for complete search history.

(56) References Cited

U.S. PATENT DOCUMENTS 6,057,600 A    5/2000  Kitazawa et al.
9,510,461 B2   11/2016 Lee et al.
(Continued)

FOREIGN PATENT DOCUMENTS

JP      4865197 B2       2/2012
KR      10-2015-0000173 A   1/2015
(Continued)

OTHER PUBLICATIONS

Korean Office Action dated Dec. 18, 2019, in counterpart Korean Patent Application No. 10-2018-0110201 (13 pages in English, 9 pages in Korean).
(Continued)

*Primary Examiner* — Hung S. Bui
(74) *Attorney, Agent, or Firm* — NSIP Law

(57) ABSTRACT

An electronic device module includes a first substrate, at least one electronic device mounted on a lower surface of the first substrate, a second substrate mounted on a lower surface of the first substrate to electrically connect the first substrate to an external source of power, a connecting conductor bonded to a lower surface of the second substrate, and a sealing portion sealing the electronic device, the second substrate, and the connecting conductor, wherein a mounting height of the second substrate is configured to be lower than a mounting height of the electronic device.

11 Claims, 6 Drawing Sheets

(51) Int. Cl.
*H05K 1/11* (2006.01)
*H05K 1/02* (2006.01)
*H05K 3/46* (2006.01)
*H05K 1/18* (2006.01)
*H05K 3/28* (2006.01)
*H05K 3/40* (2006.01)
*H05K 3/34* (2006.01)
*H05K 3/36* (2006.01)

(52) U.S. Cl.
CPC ............. *H05K 1/144* (2013.01); *H05K 1/181* (2013.01); *H05K 1/186* (2013.01); *H05K 3/284* (2013.01); *H05K 3/341* (2013.01); *H05K 3/368* (2013.01); *H05K 3/4007* (2013.01); *H05K 3/4644* (2013.01); *H05K 3/4697* (2013.01); *H05K 2201/041* (2013.01); *H05K 2201/09036* (2013.01); *H05K 2201/10545* (2013.01); *H05K 2201/10734* (2013.01); *H05K 2203/1316* (2013.01); *H05K 2203/1322* (2013.01); *H05K 2203/1327* (2013.01)

(56) References Cited

U.S. PATENT DOCUMENTS

| | | |
|---|---|---|
| 9,527,723 B2 | 12/2016 | Lin et al. |
| 9,633,923 B2 | 4/2017 | Yoo et al. |
| 10,820,456 B2 * | 10/2020 | Jung ..................... H05K 1/186 |
| 11,198,011 B2 * | 12/2021 | Yeh ...................... A61B 5/686 |
| 2006/0063312 A1 | 3/2006 | Kurita |
| 2013/0127025 A1 | 5/2013 | Cho |
| 2013/0249101 A1 | 9/2013 | Lin et al. |
| 2014/0124915 A1 * | 5/2014 | Hayashi .................. H01L 25/18 |
| | | 257/713 |
| 2015/0062854 A1 | 3/2015 | Choi et al. |
| 2015/0195913 A1 | 7/2015 | Cho |
| 2015/0325529 A1 | 11/2015 | Choi |
| 2016/0233196 A1 | 8/2016 | Kim et al. |
| 2017/0141081 A1 | 5/2017 | Lee et al. |
| 2017/0178992 A1 | 6/2017 | Jeong et al. |
| 2019/0221507 A1 * | 7/2019 | Kimura ................... H05K 1/144 |
| 2020/0235453 A1 * | 7/2020 | Lang ....................... G01S 7/032 |

FOREIGN PATENT DOCUMENTS

| | | |
|---|---|---|
| KR | 10-2015-0025129 A | 3/2015 |
| KR | 10-1712288 B1 | 3/2017 |
| KR | 10-2017-0074080 A | 6/2017 |

OTHER PUBLICATIONS

U.S. Appl. No. 16/367,641, filed Mar. 28, 2019, Chul Hwan Jung, Samsung Electro-Mechanics Co., Ltd..

* cited by examiner

ELECTRONIC COMPONENT MODULE AND MANUFACTURING METHOD THEREOF

CROSS-REFERENCE TO RELATED APPLICATIONS

This application is a continuation of application Ser. No. 16/367,641 filed on Mar. 28, 2019, now U.S. Pat. No. 10,820,456 issued on Oct. 27, 2020, and claims the benefit under 35 USC 119(a) of Korean Patent Application No. 10-2018-0110201 filed on Sep. 14, 2018, in the Korean Intellectual Property Office, the entire disclosures of which are incorporated herein by reference for all purposes.

BACKGROUND

1. Field

The following description relates to an electronic device module and a method of manufacturing the same, and more particularly, to an electronic device module which protects a passive element or a semiconductor chip included in the module from an external environment while shielding electromagnetic waves, and a method of manufacturing the same.

2. Description of Related Art

Recently, in the electronic products market, the use of portable electronic products has increased rapidly, and accordingly, there has been a demand for electronic components which are mounted on electronic systems to be small-sized and lightweight.

To achieve this, techniques have been implemented to reduce the sizes of individual electronic components. Additionally, a system-on-chip (SOC) technique which integrates individual components into a single chip, or a system-in-package (SIP) technique which integrates individual components into a single package, have been implemented.

Additionally, as mobile devices such as smartphones and tablets are being manufactured with a slim for factor while achieving high performance and multifunctionality, the demand for the miniaturization and thinning of mounting components is increasing. Therefore, there is a demand for a package technology which lowers a mounting height of a mounting component.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an electronic device module includes a first substrate, at least one electronic device mounted on a lower surface of the first substrate, a second substrate mounted on the lower surface of the first substrate, the second substrate configured to electrically connect the first substrate to an external source of power, a connecting conductor bonded to a lower surface of the second substrate, and a sealing portion that seals the at least one electronic device, the second substrate, and the connecting conductor, wherein a mounting height of the second substrate is configured to be lower than a mounting height of the electronic device.

The connecting conductor and the electronic device may be configured to be exposed to an exterior of the sealing portion, and an exposed surface of the connecting conductor and an exposed surface of the electronic device are disposed on a same plane.

A protective layer may be disposed along a surface formed by the electronic device, the second substrate, and the connecting conductor.

A shielding layer may be disposed on the protective layer.

The second substrate may include a device accommodating portion that includes a through-hole, and the electronic device may be configured to be disposed in the device accommodating portion.

The sealing portion may be disposed to cover a lower surface of the second substrate, and the connecting conductor is configured to pass through the sealing portion to be exposed to an exterior of the sealing portion.

The connecting conductor may be formed of one or more of a solder and a conductive resin.

A first element may be mounted on an upper surface of the first substrate; and a first sealing portion may be configured to seal the first element.

A shortest distance from the upper surface of the first substrate to an upper surface of the first sealing portion may be greater than a shortest distance from the lower surface of the first substrate to a lower surface of the sealing portion.

In a general aspect, a method of manufacturing an electronic device module includes mounting at least one electronic device on a lower surface of a first substrate, forming a second substrate on the lower surface of the first substrate, sealing at least one electronic device and the second substrate in a sealing portion, and exposing a portion of the at least one electronic device by partially removing a portion of the sealing portion and a portion of the electronic device.

A connecting conductor may be formed on a lower surface of the second substrate, before the forming of the sealing portion.

The connecting conductor may be formed on the second substrate after the second substrate is formed on the first substrate.

The connecting conductor may be formed on the second substrate before the second substrate is formed on the first substrate.

The forming of the sealing portion may include embedding the connecting conductor in the sealing portion.

The exposing of the portion of the at least one electronic device may include exposing the connecting conductor externally of the sealing portion by removing a portion of the connecting conductor and removing a portion of the sealing portion.

A protective layer may be formed on an exposed surface of the at least one electronic device.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
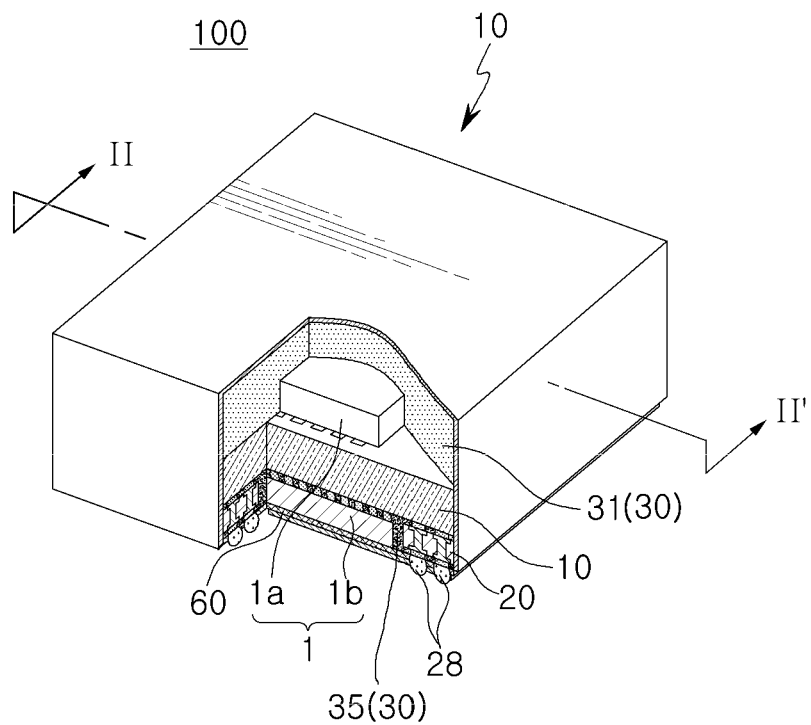
FIG. 1 is a cross-sectional view of an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
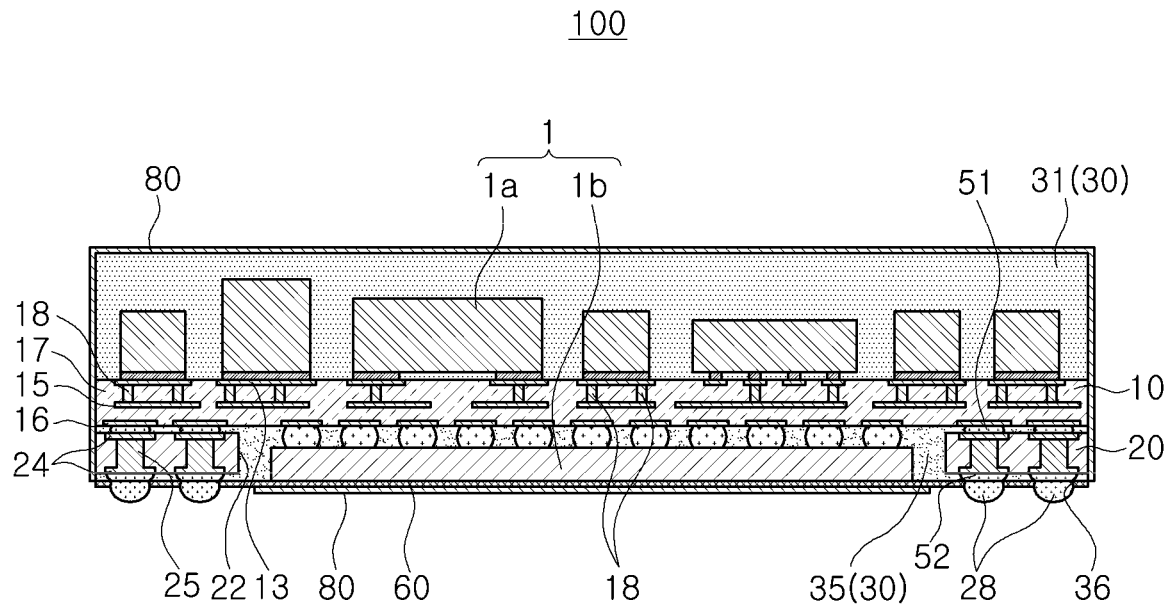
FIG. 2 is a cross-sectional view taken along the line II-II' of FIG. 1.
Figure 3:
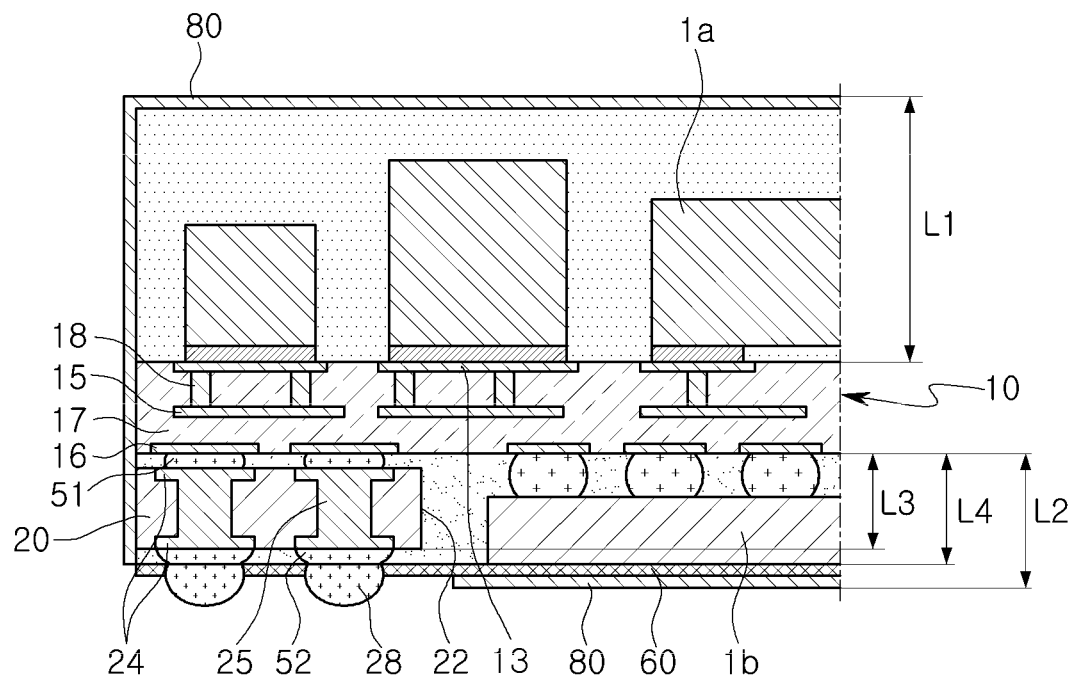
FIG. 3 is a partially enlarged view of the example of FIG. 2.

FIG. 1 is a cross-sectional view of an electronic device module according to an example, FIG. 2 is a cross-sectional view taken along the line II-II' of FIG. 1, and FIG. 3 is a partially enlarged view of the example of FIG. 2.

Referring to FIGS. 1 to 3, an electronic device module 100 according to an example may be configured to include electronic devices 1, a first substrate 10, a second substrate 20, and a sealing portion 30 including a first sealing portion 31 and a second sealing portion 35.

The electronic devices 1 may include various devices such as a passive device and an active device, and all devices to be mounted on a substrate may be used as the electronic devices 1.

The electronic devices 1 may be divided into at least one first element 1a mounted on a first surface (an upper surface) of the first substrate 10, to be described later, and at least one second element 1b mounted on a second surface (a lower surface) of the first substrate 10.

In an example, the second element 1b has an active surface, which is a surface mounted on the first substrate 10, and an inactive surface, which is a surface opposite to the active surface. Moreover, the inactive surface of the second element 1b is exposed to an exterior of the second sealing portion 35, to be described later.

In addition, the inactive surface of the second element 1b and a surface (a lower surface) of the second sealing portion 35 may be disposed on the same plane. The configuration described above may be implemented by a manufacturing method to be described later.

The second element 1b includes communications elements, for example, a Wi-Fi integrated circuit (Wi-Fi IC). The present disclosure is not, however, limited thereto.

The first substrate 10 may be a multilayer substrate formed by repeatedly stacking a plurality of insulating layers 17 and a plurality of wiring layers 15 on each other. However, as necessary, the first substrate 10 may be a double-sided substrate, in which a wiring layer 15 is formed on each of both sides of a single insulating layer 17.

A material of the insulating layer 17 is not particularly limited. For example, a material for the insulating layer may be a thermosetting resin such as an epoxy resin, a thermoplastic resin such as a polyimide resin, a resin in which the thermosetting resin or the thermoplastic resin is impregnated, together with an inorganic filler in a core material such as a glass fiber (or a glass cloth or a glass fabric), for example, an insulating material, such as prepreg, an Ajinomoto build-up film (ABF), FR-4, bismaleimide triazine (BT), or the like.

The wiring layer 15 may allow the electronic devices 1, to be described later, to be electrically connected to each other. Moreover, the wiring layer may allow the electronic devices 1 and the second substrate 20 to be electrically connected to each other.

A material of the wiring layer 15 may be a conductive material such as copper (Cu), aluminum (Al), silver (Ag), tin (Sn), gold (Au), nickel (Ni), lead (Pb), titanium (Ti), or alloys thereof.

Interlayer connecting conductors 18 for connecting the wiring layers 15, (which are stacked on each other), to each other, may be disposed in the insulating layer 17.

An insulating protective layer (not shown) may be disposed on a surface of the first substrate 10. The insulating protective layer may be disposed to cover the insulating layer 17 and the wiring layer 15 in an upper surface and a lower surface of the insulating layer 17. In this regard, a wiring layer 15, disposed on the upper surface or the lower surface of the insulating layer 17, may be protected thereby.

Moreover, a cavity (not shown), in which the electronic devices 1 may be embedded, may be formed in the first substrate 10.

The electronic devices 1 may be mounted on each of both sides of the first substrate 10. To this end, an electrode for mounting 13, which mounts the electronic devices 1 on each of both sides of the first substrate 10, or a wiring pattern, which is not illustrated, which electrically connects the electrodes for mounting 13 to each other, may be provided. The first substrate 10 may be various types of substrates, known in the art, for example, a ceramic substrate, a printed circuit board, a flexible substrate, and similar substrates.

A pad for external connection 16 may be disposed on a second surface of the first substrate 10. The pad for external connection 16 is provided to be electrically connected to the second substrate 20, to be described later, and may be connected to the second substrate 20 through a first connecting conductor 51.

Thus, the pad for external connection 16 may be disposed in a position opposing the second substrate 20, when the second substrate 20 is coupled to the first substrate 10, at a lower surface of the first substrate 10, and a plurality of pads for an external connection may be disposed in various forms.

The second substrate 20 may be coupled to a second surface of the first substrate 10, and may be electrically connected to the first substrate 10 through the first connecting conductor 51. Here, the first connecting conductor 51 may be provided as a conductive adhesive such as a solder or a conductive resin.

The second substrate 20 may be formed in a manner similar to the first substrate 10, and may be formed of various types of substrates, known in the art, for example, a ceramic substrate, a printed circuit board, a flexible substrate, and the like.

The second substrate 20 according to an example may be a multilayer substrate formed to have a plurality of layers, and a wiring pattern (not shown), for formation of electrical connection, may be provided between respective layers.

An electrode pad 24 may be formed on each of both sides of the second substrate 20. The electrode pad 24, formed on an upper surface of the second substrate 20, may be provided to be electrically connected to a pad for external connection 16 of the first substrate 10. Moreover, an electrode pad 24 formed on a lower surface is connected to an external connection terminal 28.

In addition, the second substrate 20 may include a conductive via 25 electrically connecting circuit patterns, formed in the second substrate 20, to each other.

The second substrate 20 may be formed by a method, in which a plurality of insulating layers provided with a via are prepared, and then insulating layers are stacked to electrically connect vias to each other. Alternatively, the second substrate 20 may be formed by a method, in which an insulating layer having a predetermined thickness is prepared first to form a through-hole passing through the entirety of an insulating layer, and then a via is formed in the through-hole. Moreover, the second substrate 20 may be formed in various forms. For example, a single resin layer (for example, an epoxy) is prepared, and a plurality of metal columns (for example, a Cu post) are formed to pass through a resin layer and to be embedded in the resin layer.

The second substrate 20 may be formed to have a single substrate or a plurality of substrates. In an example, the case in which the second substrate 20 is formed to have a single substrate, and a device accommodating portion 22 in the form of a through-hole is formed therein is described, by way of example.

The device accommodating portion 22 is used as a space in which the second element 1b, mounted on a second surface of the first substrate 10, is accommodated. Thus, the second element 1b, which is mounted on a second surface of the first substrate 10, may only be mounted at a position that opposes the device accommodating portion 22 of the second substrate 20. The configuration of the present disclosure is not, however, limited thereto.

Moreover, a mounting height of the second substrate 20 according to an example may be formed to be lower than a mounting height of the second element 1b, accommodated in the device accommodating portion 22. Here, the mounting height is a height measured from the second surface of the first substrate 10.

Meanwhile, a second connecting conductor 52 may be disposed on an electrode pad 24, which is disposed in a lower portion of the second substrate 20. The second connecting conductor 52 may be provided as a conductive adhesive such as a solder or a conductive resin, in a manner similar to the first connecting conductor 51, but is not limited thereto.

The second connecting conductor 52 may be disposed in the second sealing portion 35, to be described later, to electrically connect the second substrate 20 to the external connection terminal 28. Thus, the first substrate 10 is electrically connected to a main substrate (not shown) on which the electronic device module 100 is mounted via the first connecting conductor 51, the second substrate 20, the second connecting conductor 52, and the external connection terminal 28.

The external connection terminal 28 may be bonded to a second connecting conductor 52 of the second substrate 20. Thus, the external connection terminal 28 is disposed to be spaced apart from the second substrate 20 by a predetermined distance, and a second connecting conductor 52 is disposed between the external connection terminal 28 and the second substrate 20.

The external connection terminal 28 may be provided in the form of a bump, but is not limited thereto. Moreover, the external connection terminal may be provided in various forms such as a solder ball.

The sealing portion 30 includes the first sealing portion 31, which is formed on a first surface of the first substrate 10, and the second sealing portion 35, which is formed on a second surface of the first substrate 10.

The first sealing portion 31 seals the first elements 1a mounted on a first surface of the first substrate 10.

The first sealing portion 31 may be filled between the first elements 1a mounted on the first substrate 10, thereby preventing the occurrence of electrical shorts between the first elements 1a. Moreover, the first sealing portion 31 fixes the first elements 1a to the first substrate 10 while surrounding an external area of the first elements 1a, thereby safely protecting the first elements 1a from an external impact.

The first sealing portion 31 described above may be formed of an insulating material containing a resin material such as an epoxy. Moreover, the first sealing portion 31 according to an example may be formed by placing the first substrate 10, having the first elements 1a mounted on an upper surface of the first substrate 10, in a mold (not shown), and injecting a molding resin into the mold. The present disclosure is not, however, limited thereto.

The second sealing portion 35 according to an example may be disposed between the first substrate 10 and the second substrate 20, in a lower portion of the second substrate 20, and in the device accommodating portion 22.

In an example, the second sealing portion 35 is formed to cover the second substrate 20 while having the form of embedding the second substrate 20 therein. In this example, an outer side surface of the second substrate 20 may only be exposed to an exterior area of the second sealing portion 35. However, it is not limited thereto, and various modifications are possible. For example, the entirety of the second substrate 20 may be configured to be completely embedded in the second sealing portion 35.

Moreover, in an example, the second sealing portion 35 may be disposed in the form of filling the entirety of the device accommodating portion 22. Thus, the second element 1b, accommodated in the device accommodating portion 22, may be embedded in the second sealing portion 35. However, as necessary, a portion of the second element 1b may be exposed to an exterior area of the second sealing portion 35.

The second sealing portion 35 may be formed in a molding method of injecting a molding resin in a manner similar to the first sealing portion 31. In other words, the first substrate 10 in which the second element 1b and the second substrate 20 are mounted on a second surface of the first substrate 10, is placed in a mold (not shown), and a molding resin is injected into the mold, thereby forming the second sealing portion 35. However, the formation of the second sealing portion 35 is not limited thereto, and various modifications are possible. For example, a liquid resin solution may be injected and cured to form the second sealing portion 35.

Although not illustrated, an underfill resin (not shown) may be disposed between the second element 1b and the first substrate 10, if necessary. The underfill resin may be formed by injecting a liquid resin solution into a gap between the second element 1b and the first substrate 10 and then curing the liquid resin solution. In this case, the second sealing portion 35 is disposed to embed the underfill resin together.

A protective layer 60 may be disposed on a surface (for example, a lower surface) formed by the second sealing portion 35 and the second element 1b.

The protective layer 60 prevents an interface between the second element 1b and the second sealing portion 35 from peeling off, and is provided to protect an inactive surface of the second element 1b, exposed to external elements, from an external environment. The protective layer 60 is formed of an insulating material such as a resin, for example, an underfill resin or an epoxy resin, polyimide, solder resist, or similar resins, but is not limited thereto. Moreover, the protective layer 60 may be omitted, according to examples.

The second connecting conductor 52 may be exposed to an exterior of the protective layer 60 through an opening formed in the protective layer 60.

A shielding layer 80 may be disposed along a surface formed by the sealing portion 30, the first substrate 10, and the second substrate 20, and may shield electromagnetic waves flowing from an external source of power to the electronic devices 1, or flowing externally from the electronic devices 1. Thus, the shielding layer 80 may be formed of a conductive material.

In an example, the shielding layer 80 is extended from a surface of the first sealing portion 31 to a side surface of each of the first substrate 10 and the second substrate 20. In this regard, the shielding layer 80 is electrically connected to a ground pad (not shown) or a ground layer (not shown), exposed to a side surface of each of the first substrate 10 and the second substrate 20. The ground pad (not shown) or the ground layer (not shown) is provided in either one or both of the first substrate 10 and the second substrate 20.

The shielding layer 80 may be formed by applying a resin material containing conductive powder to an outer surface of the sealing portion 30, or forming a metal thin film. When the metal thin film is formed, various techniques such as sputtering, screen printing, vapor deposition, electroplating, and non-electroplating may be used.

For example, the shielding layer 80 according to an example may be a metal thin film formed using a spray coating method on a surface formed by the sealing portion 30, the first substrate 10, and the second substrate 20. By the spray coating method, an evenly coated film can be formed, and costs, in terms of infrastructure investment, may be relatively lower than implementation by other processes. The present disclosure is not, however, limited thereto.

Moreover, the shielding layer 80 according to an example may also be disposed on a surface of the protective layer 60. In this example, the shielding layer 80, disposed on a surface of the protective layer 60, is electrically connected to a shielding layer 80 disposed on a side surface, or is electrically connected to an external connection terminal 28 connected to a ground. Meanwhile, the shielding layer 80 disposed on a surface of the protective layer 60 may be omitted, as necessary.

In the electronic device module 100 according to an example configured as described above, a mounting height L3 of the second substrate 20 is configured to be lower than a mounting height L4 of the second element 1b disposed in the device accommodating portion 22. Moreover, when a plurality of second elements 1b are disposed in the device accommodating portion 22, a mounting height L3 of the second substrate 20 is configured to be lower than a mounting height L4 of at least one of the second elements 1b.

Thus, the second sealing portion 35 is also disposed in a lower portion of the second substrate 20.

In the electronic device module 100 according to an example described above, the electronic devices 1 are mounted on both sides of the first substrate 10. Moreover, the first substrate 10 is electrically connected to an external source of power through the second substrate 20 disposed on a lower surface of the first substrate 10.

Thus, a plurality of electronic devices 1 are mounted on a single substrate (that is, a first substrate 10), so a degree of integration of elements may be increased. Moreover, an input/output path of the first substrate 10 on which the electronic devices 1 are mounted is formed through the second substrate 20, a separate substrate. In this case, even when a double-sided molding is performed on the first substrate 10, an external electrical connection may be easily achieved.

Moreover, a mounting height L2 of the second surface of the first substrate 10 may be configured to be lower than a mounting height L1 of the first surface of the first substrate 10. That is, as can be seen from FIG. 3, a shortest distance L1 from the first surface of the first substrate 10 to an upper surface of a portion of the shielding layer 80 disposed above the first surface of the first substrate 10 may be configured to be greater than a shortest distance L2 from the second surface of the first substrate 10 to a lower surface of a portion of the shielding layer 80 disposed below the second surface of the first substrate 10. Also, as can be seen from FIG. 3, a shortest distance from the first surface of the first substrate 10 to an upper surface of the first sealing portion 31 is greater than a shortest distance from the second surface of the first substrate 10 to a lower surface of the second sealing portion 35. Furthermore, as discussed above, the mounting height L3 of the second substrate 20 may be configured to lower than the mounting height L4 of the second element 1b. Thus, an overall thickness of the electronic device module 100 may be significantly reduced.

Next, a method of manufacturing an electronic device module according to an example will be described.

FIGS. 4 to 11 are cross-sectional views illustrating a method of manufacturing an electronic device module according to an example.

Figure 4:
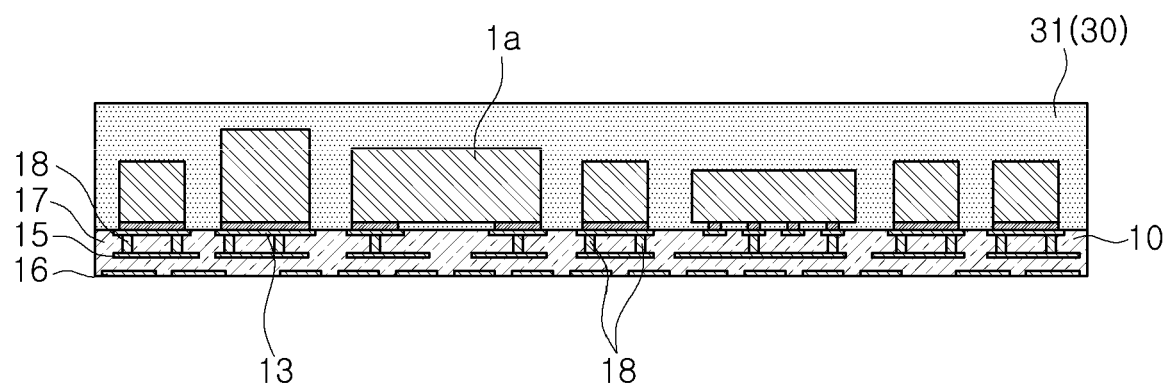
FIGS. 4 to 11 are views illustrating examples of a method of manufacturing the electronic device module illustrated in FIG. 2 in the order of a process.

First, as illustrated in FIG. 4, the preparation of a first substrate 10 is performed. As described previously, the first substrate 10 may be a multilayer substrate, and an electrode for mounting 13 may be formed on each of both sides of the first substrate 10. Moreover, a pad for external connection 16 may be formed on a lower surface of the first substrate 10.

Then, the mounting of first elements 1a on a first surface of the first substrate 10, that is, an upper surface, is performed. The operation described above may be performed through a process in which a solder paste is printed using a screen-printing method on an electrode for mounting 13 formed on one surface of the first substrate 10, first elements 1a are placed thereabove, and heat is applied thereto to cure the solder paste.

Then, the forming of a first sealing portion 31 on one surface of the first substrate 10 while sealing the first elements 1a is performed. The operation described above may be performed through a process in which the first substrate 10 on which the first elements 1a are mounted is disposed in a mold, and a molding resin is injected into the mold to form the first sealing portion 31. As the first sealing portion 31 is formed, the first elements 1a, mounted on one surface of the first substrate 10, that is, an upper surface, may be protected by the first sealing portion 31 from external influences.

Figure 5:
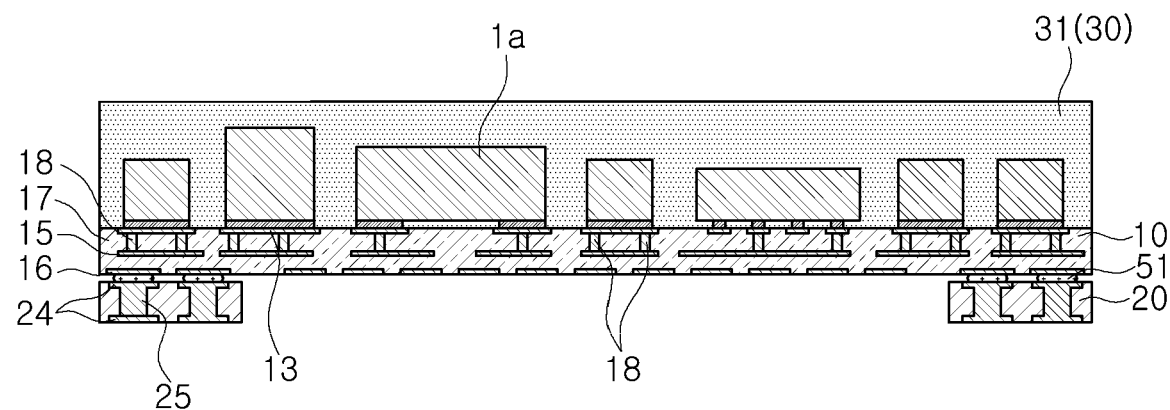

Then, as illustrated in FIG. 5, a second substrate 20 is bonded to a second surface of the first substrate 10, that is, a lower surface. The first substrate 10 and the second substrate 20 are bonded to each other through the first connecting conductor 51. The first connecting conductor 51 may be provided as a conductive adhesive such as a solder paste or a conductive resin.

Figure 6:
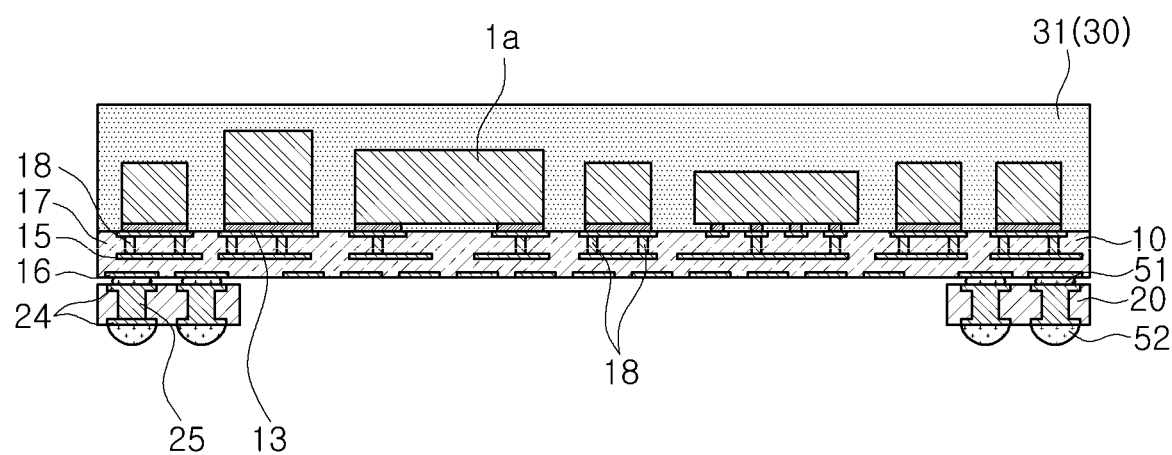

Then, as illustrated in FIG. 6, a second connecting conductor 52 is formed on a lower surface of the second substrate 20. In the operation described above, the second connecting conductor 52 is formed on an electrode pad 24 of the second substrate 20, and is provided in the form of a solder ball or a solder bump.

Figure 7:
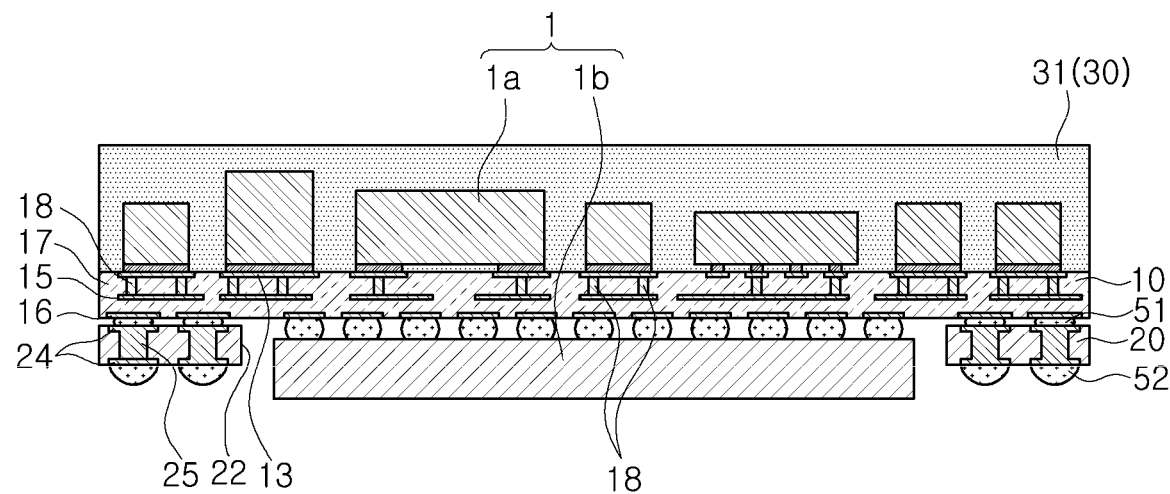

Then, as illustrated in FIG. 7, a second element 1b is mounted in the device accommodating portion 22 of the second substrate 20. The second element 1b is provided as an element of which a mounting height is greater than a mounting height of the second substrate 20.

Meanwhile, in an example, the case in which the second substrate 20 and the second element 1b are sequentially mounted on the first substrate 10 is described, by way of example, but a configuration of the present disclosure is not limited thereto. For example, the second element 1b may be mounted on the first substrate 10 first, or the second substrate 20 and the second element 1b may be simultaneously mounted on the first substrate 10.

Moreover, in an example, the case in which the second substrate 20 is mounted on the first substrate 10, and then the second connecting conductor 52 is provided is described, by way of example. However, various modifications are possible. For example, the second connecting conductor 52 is formed on the second substrate 20 in advance, and the second substrate 20 is mounted on the first substrate 10.

Figure 8:
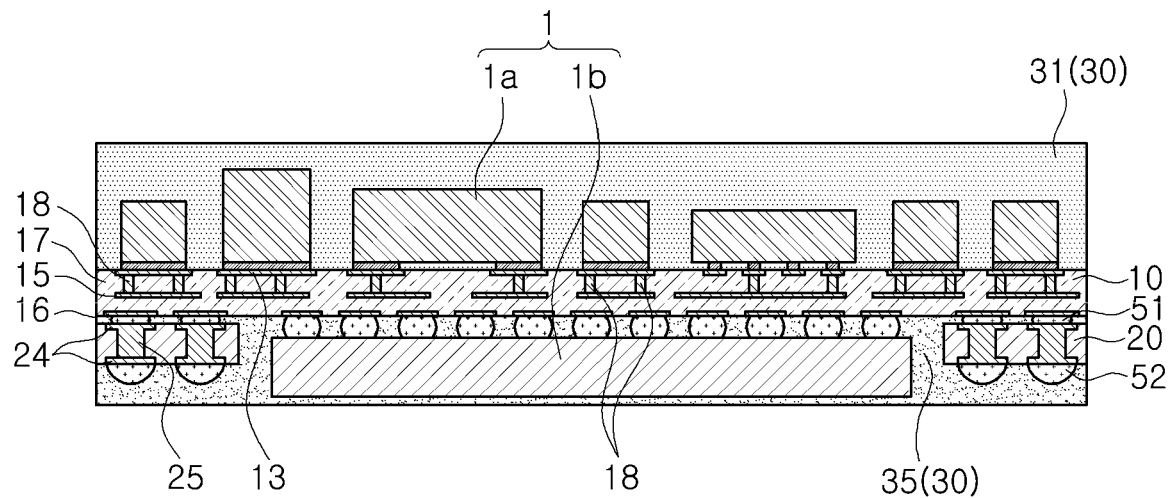

Next, as illustrated in FIG. 8, the forming of the second sealing portion 35 on the second surface of the first substrate 10 is performed. The operation described above may be performed in a manner similar to the formation of the first sealing portion 31, by placing the first substrate 10 having the second element 1b and the second substrate 20 mounted on a lower surface of the first substrate 10 in a mold, and then injecting a molding resin into the mold.

Because of the formation of the second sealing portion 35, the second element 1b and the second substrate 20, mounted on a lower surface of the first substrate 10, as well as the second connecting conductors 52 may be embedded in the second sealing portion 35.

Meanwhile, in the operation described above, the molding resin injected into the mold may also be filled in a gap formed between the first substrate 10 and the second substrate 20. Thus, the second sealing portion 35 may also be formed in a gap formed between the first substrate 10 and the second substrate 20.

In this case, the first substrate 10 and the second substrate 20 may secure insulating properties by the second sealing portion 35 filled therebetween. The second sealing portion 35 may result in a bonding force between the first substrate 10 and the second substrate 20.

Moreover, the second sealing portion 35 may also be formed on a lower surface of the second substrate 20, and may embed the second connecting conductor 52 disposed on a lower surface of the second substrate 20.

Figure 9:
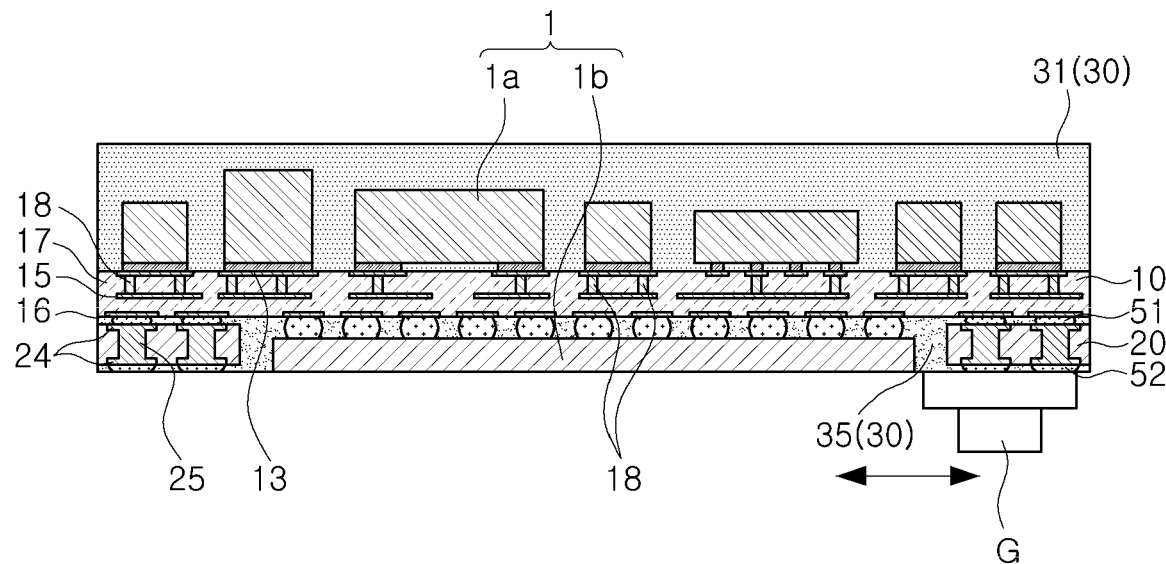

Next, as illustrated in FIG. 9, the second element 1b is exposed by partially removing the second sealing portion 35.

In the operation described above, in addition to the removal of a portion of the second sealing portion 35, a portion of the second connecting conductor 52 and a portion of the second element 1b are removed. A removal process may be performed through a grinder G.

An inactive surface of the second element 1b may be removed. Thus, through the operation described above, a thickness of the second element 1b is significantly reduced. On the other hand, the second substrate 20 is not removed in the operation described above. Thus, a mounting height of the second substrate 20 is configured to be smaller than a mounting height of the second element 1b.

In the operation described above, the second connecting conductor 52 is also partially removed, thereby significantly reducing a thickness thereof. A thickness of the second connecting conductor 52 may be provided to be a thickness that is the same as or less than the thickness of the first connecting conductor 51, but is not limited thereto.

The removing of the second sealing portion 35 is performed to significantly reduce a thickness of the second element 1b. Thus, the thickness to be substantially removed may be varied depending on a structure of the second element 1b.

Moreover, a final thickness of the second connecting conductor 52 may be defined by a difference between the mounting height L3 of the second substrate 20 and the mounting height L4 of the second element 1b.

Figure 10:
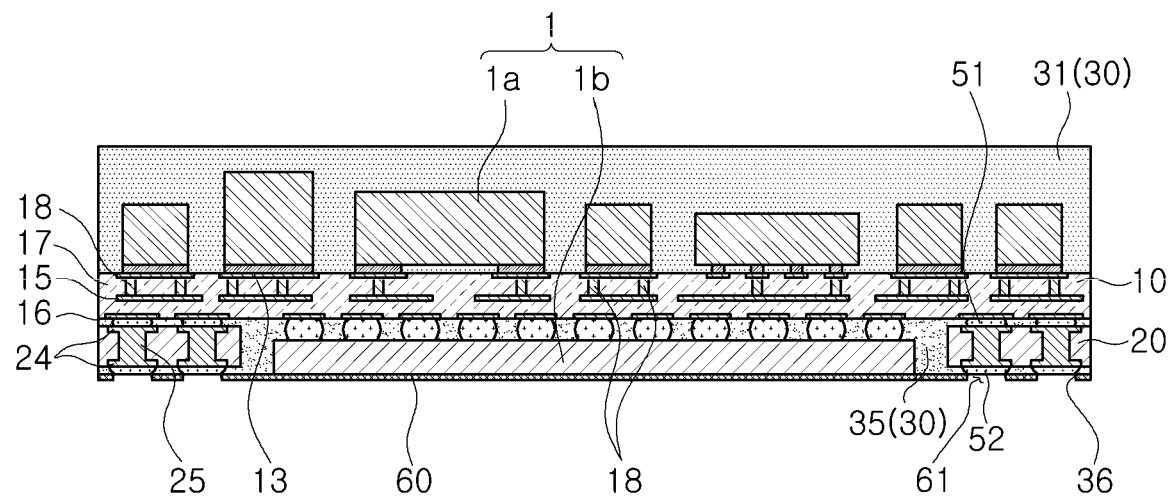

Next, as illustrated in FIG. 10, a protective layer 60 may be formed on a lower surface that is formed by the second sealing portion 35 and an inactive surface of the second element 1b, and the second connecting conductor 52, and an opening 61 is formed in the protective layer 60 to expose the second connecting conductor 52.

As described above, the protective layer 60 may be formed of an underfill resin or an epoxy resin, polyimide, solder resist, or similar materials, but is not limited thereto. Moreover, the opening 61 may be formed using a photolithography method, or a laser drilling method, but is not limited thereto.

Figure 11:
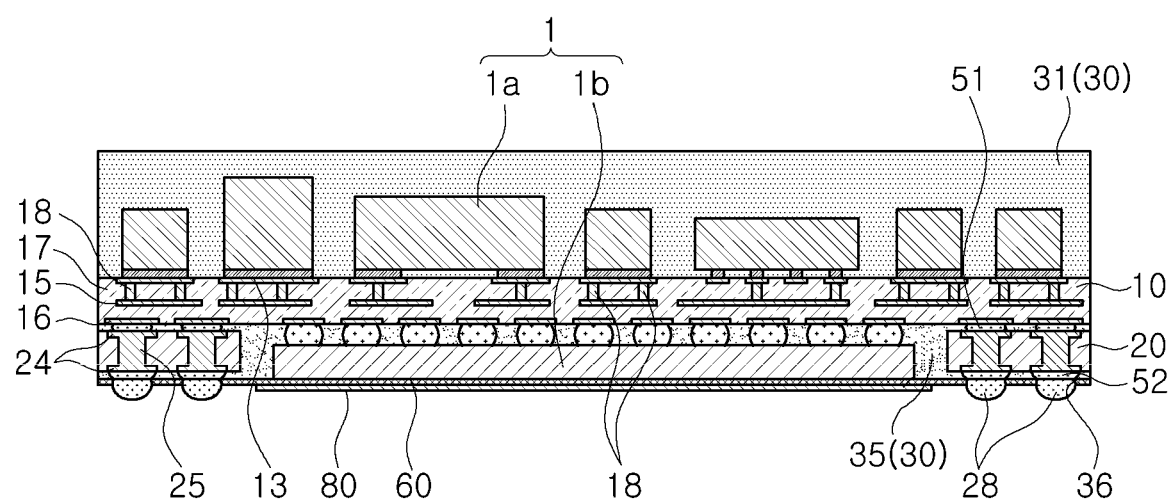

Next, as illustrated in FIG. 11, an external connection terminal 28 may be bonded to the second connecting conductor 52 which is exposed through the opening 61 of the protective layer 60, and then a shielding layer 80 may be formed on a surface of each of the sealing portion 30, the first substrate 10, and the second substrate 20, as well as a surface of the protective layer 60. Thus, the electronic device module 100 illustrated in FIG. 1 is completed.

In the electronic device module 100 according to an example manufactured as described above, to significantly reduce a thickness of a lower portion, a portion of the second sealing portion 35 is removed. In this example, only a portion of the second connecting conductor 52 is removed, while a portion of the second substrate 20 is not removed. Thus, in a process in which the second sealing portion 35 is removed, the grinder G is not in contact with the second substrate 20. Thus, the second substrate 20 is prevented from being damaged by the grinder.

In an example, the case in which the first sealing portion 31 is formed on the first surface of the first substrate 20 first is described, by way of example, but it is not limited thereto. Alternatively, the second element 1b and the second sealing portion 35 may be disposed on the second surface of the first substrate 10 first. Then, the first elements 1a and the first sealing portion 31 may be disposed on the first surface of the first substrate 10.

While various examples have been shown and described above, it will be apparent to those skilled in the art that modifications and variations could be made without departing from the scope of the present disclosure as defined by the appended claims.

For example, in examples described above, the case in which an outer side surface of the second substrate is exposed to an exterior of the second sealing portion is described, by way of example. However, as necessary, an outer side surface of the second substrate is also able to be configured in the form of being embedded in a second sealing portion. Moreover, the examples described above may be implemented in combination with each other.

As set forth above, according to examples, in the electronic device module, a mounting height of a second substrate is configured to be lower than a mounting height of an electronic device disposed in a device accommodating portion. Thus, an overall thickness of an electronic device module may be significantly reduced.

Moreover, when a second sealing portion is removed to significantly reduce a thickness of a lower portion, only a second connecting conductor is removed, while a second substrate is not removed. Thus, in a process in which the second sealing portion is removed, a grinder may not be in contact with the second substrate. Thus, a second substrate is prevented from being damaged by the grinder.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
a first substrate;
an electronic device mounted on a lower surface of the first substrate;
a second substrate mounted on the lower surface of the first substrate, the second substrate being configured to electrically connect the first substrate to an external source of power;
a connecting conductor bonded to a lower surface of the second substrate; and
a sealing portion that seals the electronic device, the second substrate, and the connecting conductor,
wherein the sealing portion covers the lower surface of the second substrate,
the connecting conductor passes through the sealing portion so that a surface of the connecting conductor is exposed to an exterior of the sealing portion, and
the exposed surface of the connecting conductor and a lower surface of the sealing portion are disposed on a same plane.

2. The electronic device module of claim 1, wherein a surface of the electronic device is exposed to the exterior of the sealing portion, and
the exposed surface of the connecting conductor, the lower surface of the sealing portion, and the exposed surface of the electronic device are disposed on a same plane.

3. The electronic device module of claim 1, further comprising a protective layer disposed along a surface formed by the electronic device and the sealing portion.

4. The electronic device module of claim 3, further comprising a shielding layer disposed on the protective layer.

5. The electronic device module of claim 1, wherein the second substrate comprises a device accommodating portion comprising a through-hole, and
the electronic device is disposed in the device accommodating portion.

6. The electronic device module of claim 1, wherein the connecting conductor is made of either one or both of a solder and a conductive resin.

7. The electronic device module of claim 1, further comprising:
a first element mounted on an upper surface of the first substrate; and
a first sealing portion that seals the first element.

8. The electronic device module of claim 7, wherein a shortest distance from the upper surface of the first substrate to an upper surface of the first sealing portion is greater than a shortest distance from the lower surface of the first substrate to the lower surface of the sealing portion.

9. The electronic device module of claim 1, wherein the mounting height of the second substrate is a shortest distance from the lower surface of the first substrate to the lower surface of the second substrate, and
the mounting height of the electronic device is a shortest distance from the lower surface of the second substrate to a lower surface of the electronic device.

10. The electronic device module of claim 1, wherein the second substrate comprises an electrode pad embedded in the lower surface of the second substrate,
the connecting conductor is bonded to the electrode pad, and
the electronic device module further comprises an external connection terminal bonded to a lower surface of the connecting conductor.

11. The electronic device module of claim 1, wherein the exposed surface of the connecting conductor is a lower surface of the connecting conductor, and
a side surface of the connecting conductor is covered by the sealing portion all around the connecting conductor.

* * * * *